United States Patent
Butschke et al.

(10) Patent No.: US 6,455,429 B1
(45) Date of Patent: Sep. 24, 2002

(54) METHOD OF PRODUCING LARGE-AREA MEMBRANE MASKS

(75) Inventors: Jörg Butschke, Stuttgart; Florian Letzkus, Tübingen, both of (DE); Elisabeth Penteker, Beaverton, OR (US); Reinhard Springer, Sulz am Neckar; Bernd Höfflinger, Sindelfingen, both of (DE); Hans Löschner, Vienna (AU)

(73) Assignee: Institut fur Mikroelektronik Stuttgart (DE)

( * ) Notice: Subject to any disclaimer, the term of this patent is extended or adjusted under 35 U.S.C. 154(b) by 0 days.

(21) Appl. No.: 09/669,469

(22) Filed: Sep. 25, 2000

Related U.S. Application Data

(63) Continuation of application No. PCT/DE99/00905, filed on Mar. 25, 1999.

(30) Foreign Application Priority Data

Mar. 25, 1998 (DE) .......................... 198 13 208

(51) Int. Cl.[7] ...................... H01L 21/302; H01L 21/461
(52) U.S. Cl. ........................ 438/690; 438/459
(58) Field of Search ................. 438/444, 459, 438/690, 738, 740, 745, 749, 949, 719, 752, 691

(56) References Cited

U.S. PATENT DOCUMENTS

| | | |
|---|---|---|
| 4,855,197 A | 8/1989 | Zapka et al. |
| 5,234,781 A | 8/1993 | Sakamoto et al. |
| 5,326,426 A * | 7/1994 | Tam et al. ............ 156/643 |
| 5,876,880 A * | 3/1999 | Vonach et al. ............ 430/5 |
| 5,962,081 A * | 10/1999 | Ohman et al. ............ 427/534 |
| 6,004,700 A * | 12/1999 | Greschner et al. ............ 430/5 |

FOREIGN PATENT DOCUMENTS

| | | |
|---|---|---|
| DE | 3730642 A1 | 3/1989 |
| DE | 39 00 526 A1 | 7/1989 |
| DE | 4109 913 A1 | 3/1991 |
| DE | 197 10 798 C1 | 7/1998 |

OTHER PUBLICATIONS

Yoshinori Nakayama, et al.; Highly Accurate Calibration Method of Electron–Beam Cell Projection Lithography, 10 pages.

* cited by examiner

*Primary Examiner*—David Nelms
*Assistant Examiner*—Phuc T. Dang
(74) *Attorney, Agent, or Firm*—St. Onge Steward Johnston & Reens LLC

(57) ABSTRACT

Inventive methods are provided for the production of large-area membrane masks, wherein an inexpedient mechanical excessive strain on the membrane or of the membrane layer/etching stop layer/supporting wafer system or the resulting breaking of the components is avoided, which excessive strain occurs particularly due to the employment of an etching cell or generally due to the thin semiconductor layers. The stripping of the semiconductor support layer is preferably performed in two partial steps that are carried out in a mechanically sealed etching cell or with a protective coating, or that one partial step is performed with an etching cell and one with a protective coating, or that the stripping of the semiconductor support layer is performed in a mechanically sealed etching cell initially with a supporting grid and that the supporting grid is removed only after withdrawal from the etching cell.

21 Claims, 3 Drawing Sheets

METHOD OF PRODUCING LARGE-AREA MEMBRANE MASKS

CROSS REFERENCE OF PENDING APPLICATION

This application is a continuation of pending International Application PCT/DE99/00905 filed on Mar. 25, 1999, which designates the United States.

DESCRIPTION

1. Field of the Invention

The present invention relates to a method of producing large-area membrane masks.

For electron and ion projection lithography as well as X-ray lithography it is necessary to produce membrane masks having a thickness in the micrometer range and a membrane area up to more than 100 square centimeters. The membrane masks produced in correspondence with the inventive method may be applied in general for lithographic methods operating on charged particles and photons. One example is the application in 157 nm lithography. Equally, an application for masking out neutral particles (atomic lithographic) and in all applications operating on vacuum evaporation masks is possible. Membrane masks as the product of a method according to the present invention are generally also suitable for use with sensors.

2. Prior Art

Starting out from silicon wafers as substrate material two different approaches are pursued in an industrial process for producing the membrane masks. They are fundamentally distinguished by the aspect whether the process steps for structuring the masks are performed before or after the production of the membrane.

In the so-called "membrane flow process", which is represented, for instance, in the U.S. Pat. No. 5,110,373, first the membrane is produced and all the steps of process for generating the mask structures are carried out on the membrane. The disadvantage of this sequence of process steps consists in the fact that the highly critical steps of mask structuring take place on a comparatively unstable membrane.

In the so-called "wafer flow process", which is disclosed, for instance, in the PCT application WO 97/43694, first the mask structures are generated on a compact silicon wafer and the membrane production takes place at the end of the mask process. The critical aspect in this process flow consists in the fact that during membrane etching no or only reproducible modifications may occur on the mask structures already existing.

In accordance with the U.S. Pat. No. 5,110,373 and the PCT application WO 97/43694 the conventional electrochemical etching stop technique with a so-called PN etching stop is employed.

All these processes of membrane mask production involve the aggravating problem that, on the one hand, the membrane must present a certain tensile stress for constituting a plane surface in a very stable manner, whilst, on the other hand, this tensile stress must be kept as low as possible because it leads inevitable to deformations of the mask structures and problems in terms of service life.

Here the wafer flow process entails clear advantages because there is fundamentally the possibility to operate on very low tensile stress levels of the membrane layer as the structuring process for the mask structures takes place on the stable wafer rather than on the membrane. However, this process gives also rise to very high demands on the membrane etching process.

The subject matter of the invention are process flows for membrane etching in the waver flow process, with the example which will be described in the following starting out from a process employing SOI (silicon on insulator) silicon wafers, as it is used for the production of so-called stencil masks. In this context reference should be made to the publication by Yoshinori Nakayama, Yasunari Sohda, Norio Saitou and Hiroyuki Itoh, entitled "Highly accurate calibration method of electronbeam cell projection lithography", in: SPIE vol. 1924 (1993), pages 185 and 190, on the SPIE Conference 1993. Stencil marks and membrane masks having opened structures in the membrane layer. The inventive solutions disclosed with reference to the SOI wafer flow process do not preclude, however, their potential application also for other waver flow or membrane flow processes.

FIG. 1 illustrates the most essential process steps of an SOI wafer flow process according to prior art:

1A SOI silicon wafer as original material, with the 2–3 µm thick silicon layer (1) forming the subsequent membrane layer on the upper side, which is insulated from the 500 to 600 µm thick compact silicon wafer (3) by a dielectric layer (2), e. g. silicon dioxide with a thickness of 200 to 400 nm, 1B application of a masking layer (4) on the upper side and a masking layer (5) on the underside of the silicon wafer, 1C structuring the masking structures on the upper side by means of lithographic processes for producing a photoresist mask (6) and subsequent plasma etching of the masking layer (4), 1D trench etching of the masking structures in the silicon layer (1) on the upper side, which has a thickness of 2–3 µm, and removal of the photoresist mask (6), 1E lithographic masking (7) and etching of a window into the masking layer (5) on the underside of the silicon wafer, 1F removal of the photoresist mask (7) for rear-side windows, 1G membrane etching process, i.e. removal of the compact silicon wafer (3) in the masked window zone (8), 1H stripping of the masking layers (4), (5) and the insulating layer (2) in the membrane region.

The membrane etching step is generally performed in anisotropic, wet chemical etching processes, e. g. using an aqueous KOH or TMAH (tetra methyl ammonium hydroxide) solution as etching agent.

The etching stop is performed on the insulating layer, but only with a restricted selectivity. As for reasons of mechanical strain the insulating layer must be kept as thin as possible and as a result of the restricted selectivity thereof the etching stop is very critical.

During the etching process, which takes a corresponding number of hours at silicon etching rates of 30–40 µm/h, the structured membrane side must be definitely reliably protected from any etching corrosion. In this operation measures must be taken to ensure that the agents used for protection of the membrane side can be removed again without any residues at the end of the process and that no geometric modifications occur on the structures in the membrane layer on account of both the protective agent and the removal thereof.

In correspondence with prior art a very reliable method is available for sealing all regions on the Si wafer outside of the window that is opened on the rear side, in other words the integration of an etching cell with seals, which are mechanically pressed against the system.

The disadvantage of such a solution consists in the aspect that there is a very high risk of breaking at the end of the etching process, i.e. at a time by which the membrane region approaches its final thickness of a few millimeters. The main cause thereof are distorsions induced by the mechanical sealing of the cell, particularly also for the reason that additional thermal distorsions occur in the etching bath which has a temperature of at least 60° C.

Moreover, it is unavoidable that during the handling of the cell and specifically in the etching bath a difference in pressures occurs between the interior of the cell and the environment, which acts upon the membrane and is inclined to destroy the latter easily.

Finally, the highly sensitive membrane must be withdrawn from the comparatively robust cell, which is equally a very critical step of the process.

Another approach consists in covering the membrane side with a protective layer presenting all the properties mentioned already, such as a sufficient resistance to etching and the possibility of removal without residues and without any influence on the membrane structures. Apart therefrom, this layer, too, may give rise to slight mechanical tensions only in the membrane/protective layer system so as to avoid any destruction of the membrane mask as early as before or during its removal.

The difficulty involved in this approach consists in the problem that to date protective layers cannot be found which satisfy all these requirements at the same time.

BRIEF DESCRIPTION OF THE INVENTION

The present invention is based on the problem of providing methods of producing large-area membrane masks, wherein an inexpedient mechanical excessive strain or deformations of the membrane or of the membrane layer/ etching stop layer/supporting wafer system, respectively, which occurs particularly as a result of the use of an etching cell or generally as a result of the thin semiconductor layers, or any resulting breaking of the components in the respective steps of method is or are avoided.

The two-step method entails additional advantages in the selection of the etching media because different etching media may be used in the first and second steps. These two etching media may be different etching agents or only different concentrations or temperatures of the same etching agent. With the etching process being stopped at a silicon dioxide layer in the SOI wafer flow process, which layer must be as thin as possible for reasons of mechanical strain, a high selectivity in etching is required. For this reason it is recommendable to perform the second etching step in this case with TMAH while the first step may be carried out in a KOH bath.

Another possibility, which derives from the two-step method, consists in the realisation of the first step as a step of dry etching in plasma.

The protective coating may be expediently configured as dielectric layer or polymer layer in correspondence with the mechanical and chemical requirements.

Moreover, the etching selectivity of the second step relative to the stop layer and the protective layer may be optimised for optimum, particularly complete, removal of the semiconductor support layer without any excessive corrosion of the stop and protective layer.

The two-step method hence offers numerous possibilities of optimisation in terms of the etching rate (productivity, costs) and selectivity (yield) of the membrane etching process (i.e. removal of the semiconductor support layer).

For both inventive methods furthermore possibilities are available for optimisation of the stop layer as such in view of the demands on the mechanical properties as well as for adaptation of the etching process to the respective stop layer. The stop layer can hence expediently consist of a dielectric layer, a metal layer, a polymer layer or a combination of layers. A sufficient selectivity of the stop layer is an important criterion of optimisation, too.

Hence the mechanical strain on the membrane layer/ etching stop layer/supporting wafer system cannot only be expediently managed but the two-step process permits in particular a selective optimisation of the mechanical strain on the membrane layer.

This may be a great advantage for both the geometric stability of the membrane mask and the accuracy of the mask structures in terms of structure and position, which us dependent thereon.

The layer or the combination of layers, respectively, may also be expediently optimised with respect to a defined conductivity in correspondence with the desired applications.

In accordance with the inventive methods the mechanical strain on the membrane may be expediently varied within wide limits from compressive strain to tensile stress by an appropriate matching of the removal of the semiconductor support layer.

By doping the membrane layer on the supporting wafer it is possible to vary the mechanical strain on the membrane mask from compressive strain to tensile stress over a wide range. The SOI wafer flow process as described in the embodiment is particularly well appropriate for this purpose. The dielectric layer causes the etching stop independently of the doping level of the silicon layer disposed thereon. It is thus possible to dope the silicon layer at option, i.e. exclusively in the sense of an optimum membrane tension.

The application of the SOI technology presents further advantages over the conventional electrochemical etching stop technique, such as the advantages that the method is simplified and its efficiency is improved, that hence the yield is increased and that the method can be performed at lower costs.

The conventional electrochemical etching stop technique permits only a method operating on an etching cell, with etching being possible only in a single step. Moreover, only comparatively small membranes are conventionally manufactured.

With the masking layer being structured for etching of the semiconductor support layer being performed as a first step of the method or as part of the manufacture of the original material for the semiconductor wafer, any faults occurring in this process cannot result in a rejection of parts which have already incurred substantial costs, which is another advantage. Hence costs are reduced by this expedient embodiment of the method.

The invention will be described in the following by exemplary embodiments, with reference to the drawing, without any restriction of the general inventive idea, to which drawing explicit reference is made in all other respects as far as the disclosure of all inventive details is concerned which are not explained completely in the text. The inventive solutions described for the example of the SOI wafer flow process do not preclude their potential application also for other wafer flow or membrane flow processes.

BRIEF DESCRIPTION OF THE DRAWING

The present invention will be described in more details in the following by embodiments with reference to the drawing wherein.

DESCRIPTION OF THE EMBODIMENTS

Embodiment 1

As protective layers can be produced which satisfy the specific demands, however only in the form of a very thin layer and hence also with a highly limited resistance to etching, a two step process is employed by the present invention.

The operating unit comprises two elements 101 which are pivotable in a forward and rearward direction along the longitudinal axis L of the instrument and which are components of the surface of the operating unit. A fastening block 103 is mounted by means of screws 102 on each element is employed for membrane etching in accordance with the present invention.

First etching is performed in an etching cell up to a residual thickness at which the membrane region has a stability so sufficient that there is no risk of destruction, neither in the etching process nor in cell handling, nor during stripping of the partly etched membrane mask. The residual etching is performed in a second step, operating on a protective layer on the membrane side. To this end, the partly etched membrane mask is inserted into a simple wafer support so that it is not exposed to any enforced mechanical or thermal forces when it is immersed into the etching bath. In the first step, approximately 90% of the thickness of the layer are removed and then, in a second step, the residual thickness of the layer is stripped up to the membrane thickness. Both dielectric layers and polymer layers may be employed as protective layers which are applied either on the structured masking layer or, upon previous stripping of the masking layer, directly on the structured membrane layer.

Figure 1A:
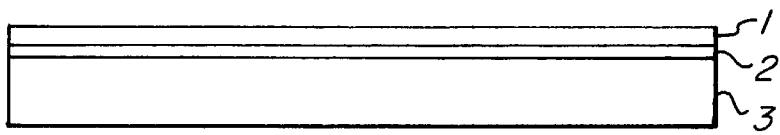
FIG. 1 illustrates a wafer flow process operating on SOI (silicon on insulator) silicon wafers, particularly for the manufacture of so-called stencil masks in correspondence with prior art as discussed in the introduction to the description.
Figure 1B:
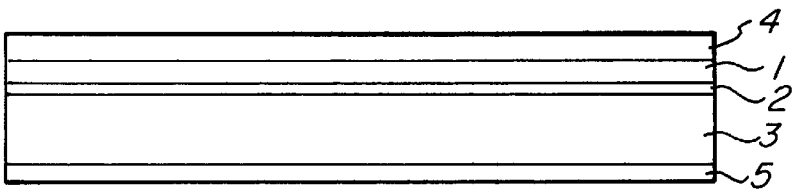
Figure 1C:
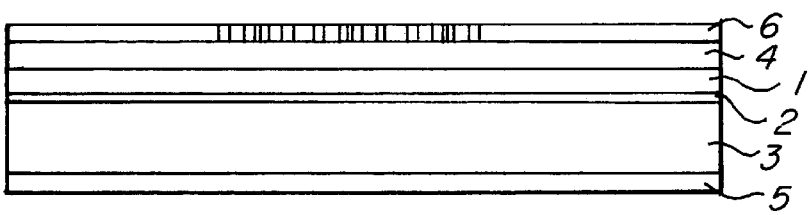
Figure 1D:
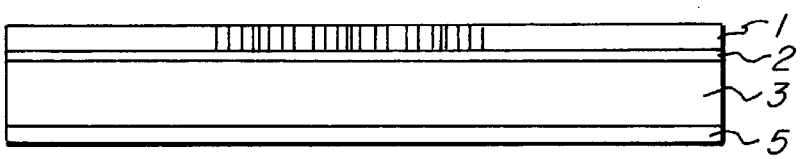
Figure 1E:
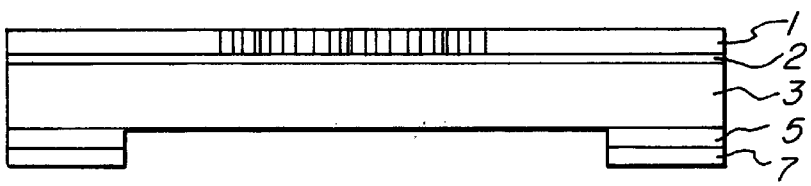
Figure 1F:
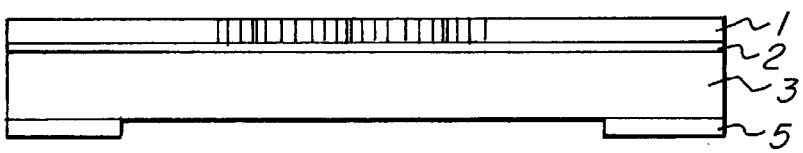
Figure 1G:
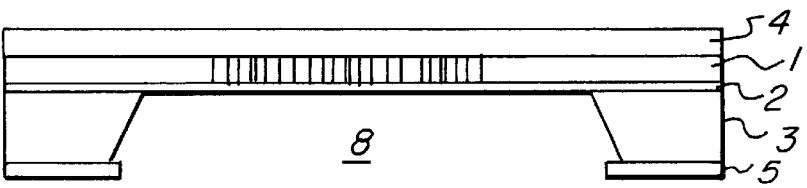
Figure 1H:
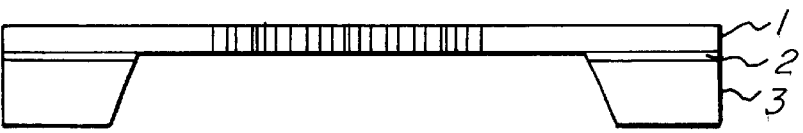
Figure 2A:
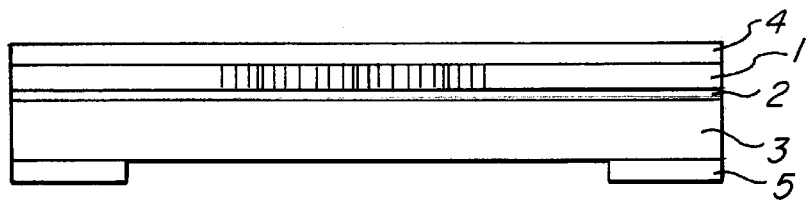
FIG. 2 represents an inventive method of producing large-area membrane masks with application of a two-step process for membrane etching.
Figure 2B:
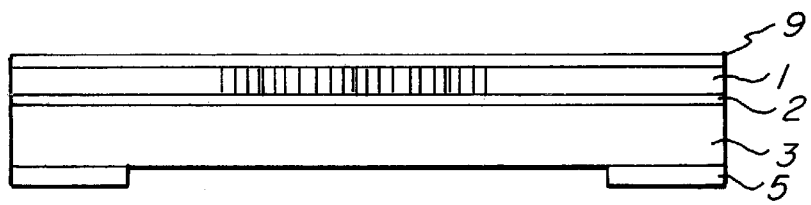
Figure 2C:
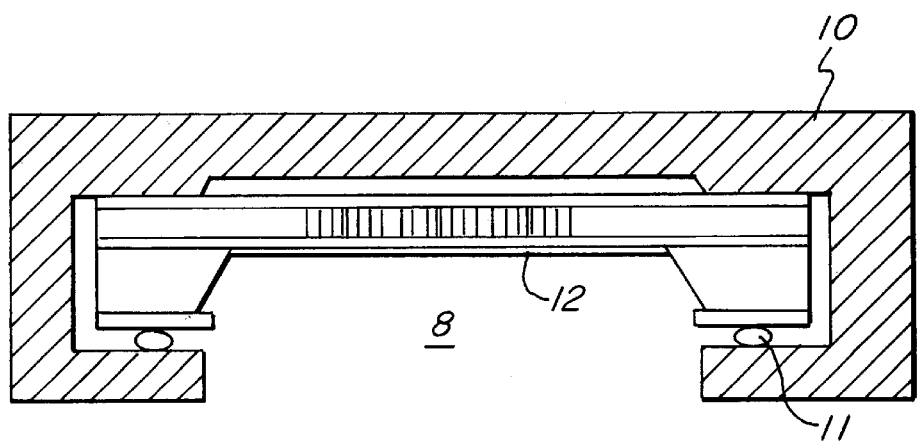
Figure 2D:
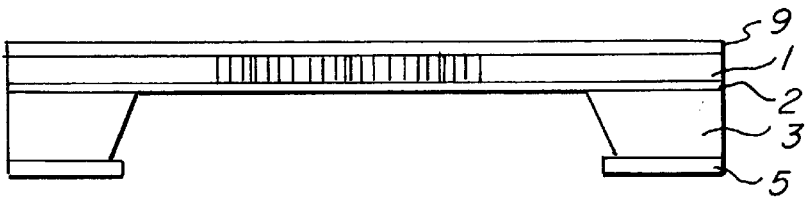
Figure 2E:
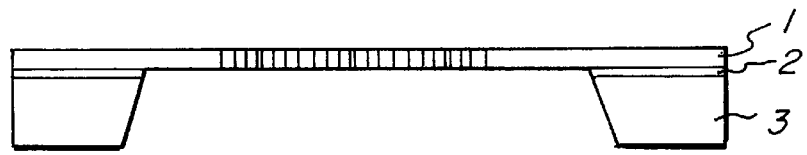

FIG. 2 is a schematic illustration of the essential steps of the two-step process:

2A the starting point is the step of process F as shown in FIG. 1, i.e. a processed SOI wafer with the structured membrane side (1)+(4) and the opened rear-side window (5) for membrane etching;

2B the protective layer (9), which is required for the second etching step, is applied on the structured membrane side, either on the masking layer (4) or, as illustrated in the drawing, after stripping of the masking layer, on the membrane layer (1);

2C mounting the structured silicon wafer in an etching cell (10) with a mechanical cover (11) and etching the silicon in the opened window (8) up to a residual thickness (12);

2D withdrawal of the partly etched silicon wafer from the etching cell and continued etching in the etching bath up to the stop layer (2);

2E stripping the protective layer (9) and the masking layer (5) as well as the etching stop layer (2) in the membrane region.

Embodiment 2

Another approach to reduce the risk of breaking during the etching process in an etching cell consists, in accordance with the invention, in the provision that the silicon layer is not stripped over a large area immediately but that a supporting grid is left by appropriate masking within the etching window so that initially minor membrane areas are created. The membrane mask is hence stripped from the etching cell still in a condition of higher stability. The etching stop layer—and simultaneously also the supporting grid—is stripped only after withdrawal from the cell, which supporting grid is lifted off by etching underneath. With the interior mechanical strain being removed as the stop layer is stripped, the strain caused by the stop layer and its compensation that is partly induced by the supporting grid are removed practically simultaneously.

Figure 3A:
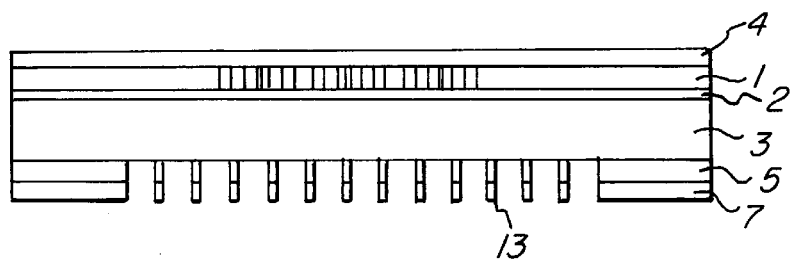
FIG. 3 illustrates an inventive method of producing large-area membrane masks with application of a supporting grid for membrane etching.
Figure 3B:
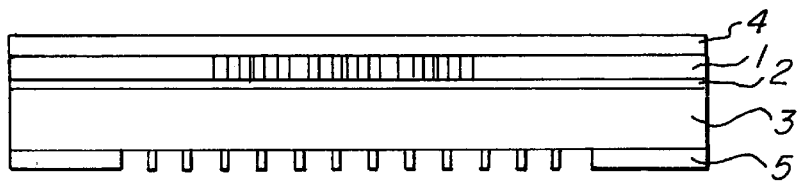
Figure 3C:
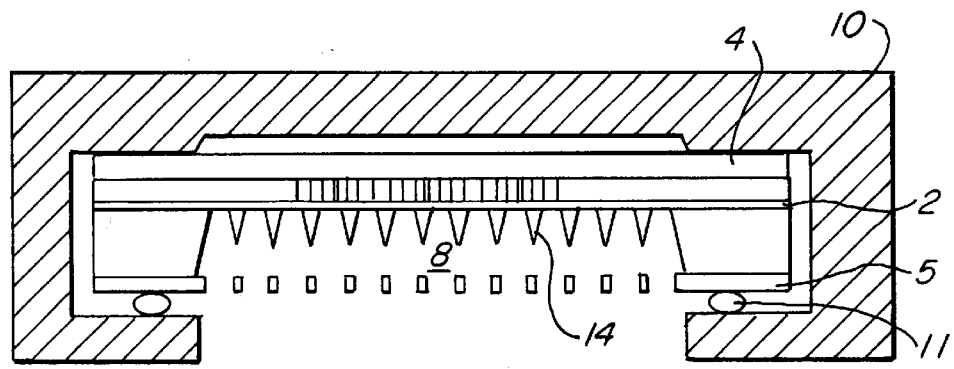
Figure 3D:
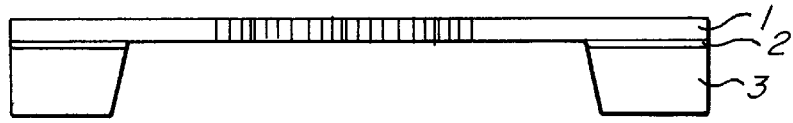

FIG. 3 is a schematic illustration of all the steps of the process operating on a supporting grid:

3A the starting point is the process step E in FIG. 1, wherein the structuring of the rear-side window (5) has been supplemented with the photoresist mask (7) due to the simultaneous structuring of a grid masking (13);

3B stripping of the photoresist mask (7) for structuring the rear side;

3C mounting the structured silicon wafer in an etching cell (10) with mechanical sealing (11) and etching the silicon in the opened grid windows (8) up to the stop layer;

3D withdrawal of the membrane mask from the etching cell and stripping of the masking layers (4)+(5) as well as the etching stop layer (2), with the supporting grid (14) being lifted along with the stop layer due to etching underneath.

What is claimed is:

1. Method of producing large-area membrane masks on the basis of multi-layer semiconductor wafers, said method comprising the steps of:

providing a multi-layer SOI (silicon on insulator) wafer having a first silicon layer, a dielectric layer, and a second silicon layer, said dielectric layer being disposed between said first and said second silicon layers, structuring said first silicon layer with a mask structure for creating a structured membrane region, etching said second silicon layer in a first etching step up to a residual thickness at which said membrane region has a stability so sufficient that there is substantially no risk of destruction, and etching said second silicon layer in a second etching step for removing said residual thickness, wherein said dielectric layer causes an etching stop.

2. Method according to claim 1, wherein said first and second etching steps are selected from the group comprising steps of wet etching, steps of dry etching, or a combination of these.

3. Method according to claim 1, wherein said first silicon layer is 2–3 $\mu$m in thickness.

4. Method according to claim 1, further comprising a step of stripping said dielectric layer.

5. Method according to claim 4, wherein different wet chemical etching media are employed in said two etching steps.

6. Method according to claim 4, wherein different etching media, each with a different concentration and/or a different temperature, are employed, in said two etching steps.

7. Method according to claim 1, wherein said first etching step is performed in a mechanically sealed etching cell.

8. Method according to claim 7, wherein said second etching step is performed after withdrawal of the partly etched silicon wafer from said etching cell.

9. Method according to claim 1, wherein approximately 90% of the thickness of said second silicon layer are removed in said first etching step.

10. Method according to claim 1, wherein said first silicon layer is doped exclusively in the sense of an optimum membrane tension.

11. Method of producing large-area membrane masks on the basis of multi-layer semiconductor wafers, wherein a semiconductor membrane layer that exists on a stop layer is structured and the semiconductor support layer and the stop layer are stripped in partial steps, characterized in that the stripping of said semiconductor support layer is performed in a mechanically sealed etching cell initially with a supporting grid, and that said supporting grid is stripped only after withdrawal from said etching cell.

12. Method according to claim 11, wherein the optimum strain on said semiconductor membrane layer is adjusted independently by doping said semiconductor membrane layer.

13. Method according to claim 11, wherein said method is a wafer flow process.

14. Method according to claim 13, wherein said method is an SOI (silicon on insulator) wafer flow process.

15. Method according to claim 11, wherein said supporting grid is stripped, by etching underneath, together with said stop layer.

16. Method according to claim 11, wherein said stop layer is selected from a group comprising a dielectric layer, a metal layer, a polymer layer or a combination of these.

17. Method according to claim 11, wherein said layers present a defined conductivity.

18. Method according to claim 11, wherein mechanical strain on said membrane layer may be varied from compressive strain to tensile stress within wide limits by an appropriate adaptation of the stripping of said semiconductor support layer.

19. Method according to claim 11, wherein said method is a membrane flow process.

20. Method according to claim 19, wherein said stop layer is a dielectric layer.

21. Method according to claim 11, wherein structuring of said masking layer for etching of said semiconductor support layer is performed as a first step of the method or within the scope of the production of the original material for said semiconductor wafers.

* * * * *